United States Patent [19]

Hashimoto

[11] Patent Number: 5,157,877

[45] Date of Patent: Oct. 27, 1992

[54] METHOD FOR PREPARING A SEMICONDUCTOR WAFER

[75] Inventor: Hiromasa Hashimoto, Fukushima, Japan

[73] Assignee: Shin-Etsu Handotai Co., Ltd., Japan

[21] Appl. No.: 841,473

[22] Filed: Feb. 26, 1992

Related U.S. Application Data

[62] Division of Ser. No. 688,108, Apr. 19, 1991, Pat. No. 5,101,602.

[51] Int. Cl.$^5$ .............................. B24B 7/19
[52] U.S. Cl. .......................... 51/283 R; 51/281 R
[58] Field of Search .................. 51/281 R, 283 R

[56] References Cited

U.S. PATENT DOCUMENTS 5,096,854  3/1992  Saito et al. .................... 51/281 R Primary Examiner—Bruce M. Kisliuk
Assistant Examiner—E. Morgan
Attorney, Agent, or Firm—Townsend, Snider & Banta

[57] ABSTRACT

A backing pad be used in a holding jig for holding a semiconductor wafer in the step of mirror polishing comprises a hydrophobic foam, possessed rigidity such that the difference between the thickness $T_1$, thereof under a load of 300 gf/cm$^2$ and the thickness, $T_2$, thereof under a load of 1,800 gf/cm$^2$ ($T_1 - T_2$) is in the range of from 1 to 100 μm, and has holes formed therein in a diameter in the range of 10 to 30 μm through the wafer-holding surface thereof.

The polishing of a semiconductor is effected by a method which comprises preparing a finished backing pad by the precision surface machining operation, setting the semiconductor wafer on a wafer holding jig having a template containing at least one wafer-positioning hole fixed on a carrier plate in such a manner that the backing pad enters the positioning hole, and polishing the semiconductor wafer.

2 Claims, 4 Drawing Sheets

METHOD FOR PREPARING A SEMICONDUCTOR WAFER

CROSS REFERENCE TO A RELATED APPLICATION

This is a divisional of co-pending application Ser. No. 07/688,108, filed Apr. 19, 1991, now U.S. Pat. No. 5,102.602.

BACKGROUND OF THE INVENTION

1. Field of the Invention

This invention relates to a backing pad to be used in a holding jig for holding a semiconductor wafer in the step of mirror polishing the semiconductor wafer, a method for precision surface machining the wafer-holding surface of the backing pad, and a method for polishing a semiconductor wafer by the use of the backing pad.

2. Description of the Prior Art

Generally, a semiconductor wafer is held fast in position on a polishing carrier plate for the purpose of allowing the surface thereof to be subjected to mirror polishing. In the methods which are available in this case for holding the wafer on the polishing carrier plate, the wax method which comprises applying wax to one surface of the wafer and fixing the wafer to the carrier plate by way of the medium of the wax, the waxless method which resorts to tight adhesion by virtue of vacuum, and the waxless method which comprises applying the wafer wet to the polishing carrier plate with the aid of an incompressible material made of a porous resin are in popular use.

In the wax method, the unevenness of the thickness of the adhesive layer is directly reflected in the flatness, parallelism, etc. of the wafer. The adhesive layer, therefore, must be given a uniform thickness. The work of uniformizing the thickness of the adhesive layer, however, is unusually difficult and calls for skill. Recently, the trend of integrated circuit devices toward even higher density has come to urge growing exaction of the precision of wafer. Since the application of wax is manually carried out, the uniformity and reproducibility of the thickness of the adhesive layer have their own limits. The adhesion by the use of wax inevitably necessitates the work of removal of the used wax as an after treatment and thus has constituted itself one cause for obstructing automation of the operation of the wax method.

Various studies have been made in search of waxless methods. Japanese Patent Application Disclosure SHO 61 (1986)-14,854 discloses a method which comprises setting a wafer fast in place by virtue of surface tension as with water on an elastic material of a foamed polyurethane sheet and polishing the immobilized wafer and Japanese Utility Model Application Disclosure SHO 63(1988)-10,057 discloses a method which comprises effecting the polishing of a wafer by use of a wafer-polishing jig having a template 13 containing at least one wafer-positioning hole superposed on a work-fixing mat 15 attached fast to a plate as illustrated in FIG. 6, for example.

In the method disclosed in Japanese Patent Application Disclosure SHO 61(1986)-14,854, since the foamed polyurethane sheet is a sheetlike material or a cut piece thereof, the thickness of the sheet is not accurately uniform and the surface thereof is not flat and smooth throughout the entire area thereof. When this foamed polyurethane sheet is used, therefore, the wafer cannot be mirror polished to uniform thickness. When this foamed polyurethane sheet is hydrophilic in quality, it give rise to a thin film of water and consequently suffers from a decline of adhesive force arising from surface tension at the time that the wafer is set in place thereon. When the foamed polyurethane sheet has pores of large diameters, since the adhesive force exhibited to the wafer is lowered, the disadvantage arises that the wafer being polished moves, rotates, or flies out and the abradant permeates to the reverse side of the wafer.

In the method disclosed in Japanese Utility Model Application Disclsure SHO 63(1988)-10,057, when a wafer is polished as set in place on the polishing jig having the template 13 attached fast on the work-fixing mat 15, stress is exerted on the reverse side of a wafer 14 as illustrated in FIG. 7 and the work-fixing mat 15 contiguous to the reverse side of the wafer 14 is depressed because this mat is made of an elastic material. In contrast, the work-fixing mat 15 contiguous to the template 13 is not notably depressed because no noticeable stress is exerted on the template 13. The depression formed in the work-fixing mat 15 contiguously to the peripheral region of the reverse side of the wafer 14 is smaller than the depression formed in the central part of the reverse side of the wafer because of the stress exerted upon the central part of the reverse side of the wafer and the elastic force inherent in the work-fixing mat 15. As a result, the peripheral region of the wafer-polishing surface is bent away above the central part thereof. When the polishing is continued in this state, a polishing stock 23 of the wafer 14 illustrated in FIG. 8 (a) is polished off by a polishing pad 22. After completion of the polishing work, a polished surface 20 of the wafer forms a sagging corner 23. The periphery thereof as illustrated in FIG. 8 (b). Thus, the polishing work fails to give a uniform thickness to the wafer throughout its area.

This invention, intended to solve the problem of the prior art described above, has as an object thereof the production of a wafer excelling in parallelism and flatness by polishing a wafer held fast in place with a backing pad exhibiting highly satisfactory adhesive force to a wafer and excelling in parallelism and flatness.

SUMMARY OF THE INVENTION

The first aspect of this invention is to provide a backing pad for use in a holding jig for holding a semiconductor wafer in the step of mirror polishing the semiconductor wafer, which backing pad is characterized by comprising a hydrophobic foam, possessing rigidity such that the difference between the thickness, $T_1$, thereof under a load of 300 gf/cm$^2$ and the thickness, $T_2$, thereof under a load of 1,800 gf/cm$^2$ ($T_1-T_2$) is in the range of from 1 to 100 μm, having pores formed therein in diameter in the range of 10 to 30 μm through the wafer-holding surface thereof.

The second aspect of this invention is to provide a method for precision surface machining of a backing pad for use in a holding jig for holding a semiconductor wafer in the step of mirror polishing the semiconductor wafer, which method comprises fixing a backing pad blank on a carrier plate with the wafer-holding surface thereof laid upwards and surface grinding the wafer-holding surface of said backing pad blank with a precision surface grinder until the flatness thereof reaches a level such that the difference between the maximum and the minimum of, $TV_5$, of thickness of said backing pad measured at a total of five points, i.e. one point at the center thereof and four points at an inward distance of 5 mm from the terminals of two perpendicularly intersecting diameters thereof, after one minute's exertion thereto of a load of 300 gf/cm$^2$ is not more than 1 μm.

The third aspect of this invention is to provide a method for polishing a semiconductor wafer, characterized by preparing a finished backing pad by precision surface machining, placing the semiconductor wafer on a wafer holding jig having a template containing at least one wafer-positioning hole fixed on a carrier plate in such a manner that the backing pad enters the positioning hole, and polishing the semiconductor wafer.

DETAILED DESCRIPTION OF THE INVENTION

Now, the present invention will be described in detail below.

Figure 1:
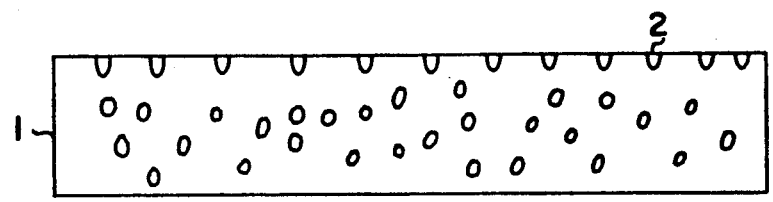
FIG. 1 is a typical cross section of a backing pad of the present invention.

A backing pad of this invention is illustrated in FIG. 1. A backing pad 1 of this invention is a hydrophobic foam which is provided in the surface thereof with numerous pores 2. Since a semiconductor wafer is caused by the hydrophilic surface tension of water to adhere fast to the backing pad 1, a thin film of water is suffered to occur on the hydrophilic surface of the backing pad and impair the adhesive force and induce idle rotation of the wafer during the polishing work. To preclude this trouble, therefore, the backing pad of this invention is required to be made of a hydrophobic material. The pores 2 are required to have diameters in the range of from 10 to 30 μm. If the diameters of the pores exceeds 30 μm, no desirable polishing is obtained because the backing pad exhibits poor adhesive force to the wafer and suffers the wafer to move and rotate idly during the polishing work. If the diameter of the pores is less than 10 μm, the adhesive force exhibited by the backing pad to the wafer is increased and the air entrapped in the interface of adhesion between the backing pad and the wafer is not allowed to escape and the wafer fails to acquire satisfactory parallelism at the end of the polishing.

Further, since the backing pad of this invention is a foamed resin, it possesses elasticity and moderate softness. This softness is defined by this invention to be such that the difference between the thickness, $T_1$, of the backing pad after application of a load of 300 gf/cm$^2$ and the thickness, $T_2$, of the backing pad after application of a load of 1,800 gf/cm$^2$, $(T_1-T_2)$, is in the range of from 1 to 100 μm.

The difference $(T_1-T_2)$ is a factor such that its magnitude proportionally increases with softness and proportionally decreases with rigidity.

The softness of this definition indicates the difference of compressive strain between the two magnitudes of compressive stress, 300 gf/cm$^2$ and 1,800 gf/cm$^2$ and represents a quantity roughly equaling the reciprocal of compressive elasticity. Since the magnitude 300 gf/cm$^2$ corresponds to the lowest pressure to be exerted on the backing pad during polishing work, the softness of the definition given above may well be regarded as representing a quantity corresponding to the reciprocal of the compressive elasticity under the compressive stress during the polishing work.

If the difference $(T_1-T_2)$ is less than 1 μm, the backing pad fails to offer satisfactory polishing because it acquires unduly high rigidity, exhibits poor adhesive force to the wafer, and suffers the wafer to move and rotate idly. Conversely, if this difference $(T_1-T_2)$ exceeds 100 μm, the foam of the backing pad is too soft for the backing pad to be machined with sufficient accuracy as by precision surface grinding and finished with satisfactory parallelism.

The backing pad of this invention possesses the difference between the maximum and the minimum, $TV_5$, of thickness measured by the use of a fixed pressure thickness measuring device at a total of five points, one point at the center of the device and four points at an inward distance of 5 mm from the terminals of two perpendicularly intersecting diameters after one minute's exertion of a load of 300 gf/cm$^2$ is not more than 1 μm. Thus, the backing pad possesses uniform elasticity throughout the entire area and allows mirror polishing capable of imparting highly satisfactory parallelism and flatness to the wafer.

The backing pad of this invention has the shape of a disc the outside diameter of which is substantially equal to the outside diameter of the wafer. The difference between the diameter of the wafer-positioning hole in the template and the outside diameter of the wafer is desired to be within 1 mm.

One example of the method available for the production of the backing pad of this invention comprises applying a hydrophobic foaming resin such as a polyether type urethane to a film, foaming the applied layer of the resin, and there after grinding the surface of the foamed resin. In this case, the foam may be separated from the film and put to use or it may be used as left adhering to the film. Optionally, the foam produced by some other suitable method than the method described above may be used.

Figure 2:
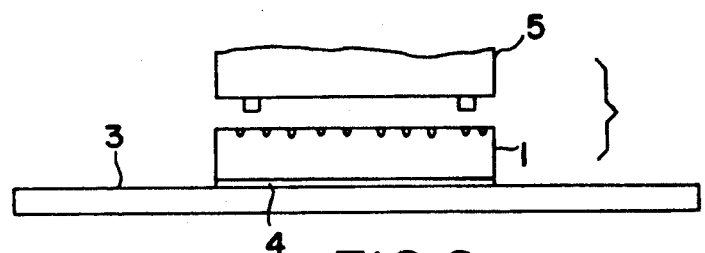
FIG. 2 is a cross section illustrating the state of precision surface machining performed on the backing pad of this invention.

To be used for polishing a wafer, the wafer-holding surface of the backing pad is required to possess perfect flatness. This invention, therefore, subjects the wafer-holding surface of the backing pad obtained by the method described above to a precision surface grinding work. In this case, the backing pad 1 is applied fast with adhesive agent 4 to a carrier plate 3, with the wafer-holding surface thereof held upwards as illustrated in FIG. 2 before it is subjected to the surface grinding work. The precision surface grinding is accomplished by grinding the wafer-holding surface of the backing pad with a surface grinder 5 incorporating therein cup wheels having implanted in the surface thereof as cemented with a sintered metal the abrasive grains such as of diamond measuring 50 to 100 μm in average diameter and exhibiting hardness greater than the backing pad 1, until the difference between the maximum and the minimum of thickness, $TV_5$, of the backing pad measured at a total of five points, one point at he center and four points at an inward distance of 5 mm from the terminals of two perpendicularly intersecting diameters after one minute's application of a load of 300 gf/cm$^2$ decreases below 1 μm.

Figure 3:
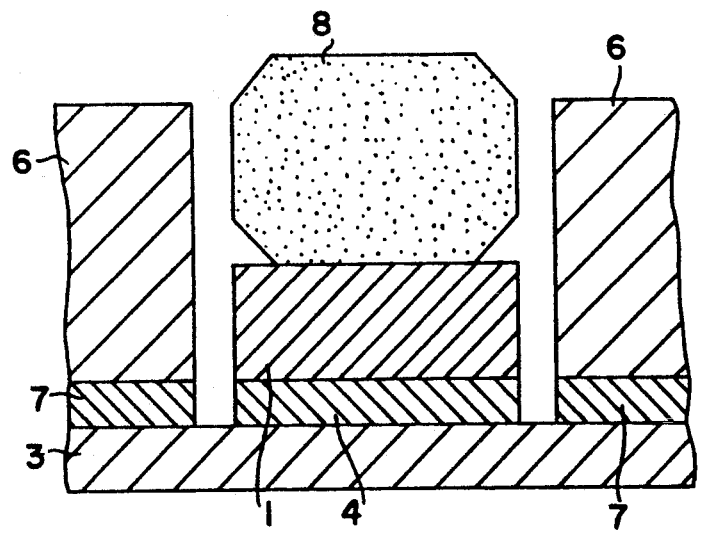
FIG. 3 is a cross section of a wafer holding jig using a backing pad resulting from the precision surface machining operation.

The backing pad 1 the wafer-holding surface of which has undergone the precision surface grinding work described above is used as still kept applied fast to the carrier plate 3 to produce a wafer holding jig. Specifically, a template 6 possessing at least one wafer-positioning hole is fastened to the carrier plate 3 through the medium of adhesive agent 7 as illustrated in FIG. 3. Since a semiconductor wafer 8 is retained by the backing pad 1, the backing pad 1 enters the wafer-positioning hole of the template 6. In this case, a gap is interposed between the backing pad 1 and the template 6 at their periphery so as to absorb the lateral extension which the backing pad 1 is forced to produce under the pressure exerted thereon during the wafer polishing work. The size of this gap is desired-to be in the range of from 0.5 to 1.5 mm. Specifically, this gap is desired to be selected in the aforementioned range of 0.5 to 1.5 mm so as to suit the rigidity of the backing pad and the pressure applied during the polishing work in due consideration of the expansion of the backing pad during the compressive deformation. If this gap is less than 0.5 mm, the wafer cannot be polished to a uniform thickness because the backing pad comes into contact with the template 6 during the polishing work and the peripheral portion of the wafer-holding surface of the backing pad 1 is pushed up. Conversely, if this gap exceeds 1.5 mm, the disadvantage arises that the reverse side of the wafer is separated from the backing pad by the vibration of the wafer during the polishing work.

The template 6 itself is required to possess flatness and paralleism.

During the polishing work, the wafer 8 is kept in fast attachment to the backing pad 1. At this time, water is applied to the wafer-holding surface of the backing pad 1 and excess water is removed from the surface. Then, the wafer 8 is caused to adhere fast to the backing pad, with the center part of the wafer 8 pressed down lest air should permeate to the boundary between the wafer-holding surface of the backing pad 1 and the wafer 8.

By having the wafer polished as kept fast to the wafer holding jig of FIG. 3 as described above, there can be obtained a finished wafer enjoying highly satisfactory flatness and paraleism.

Now, this invention will be described more specifically below with reference to working example.

EXAMPLE 1

A foaming resin composition of a polyether type urethane was applied to Myler film (produced by Toray Industries, Inc.) and the applied layer of the resin composition was foamed by heating to 60° C. Then, the surface of the foamed resin layer was ground with a buffing device and the resin layer with a ground surface was cut in a prescribed size, to produce a backing pad.

Figure 4:
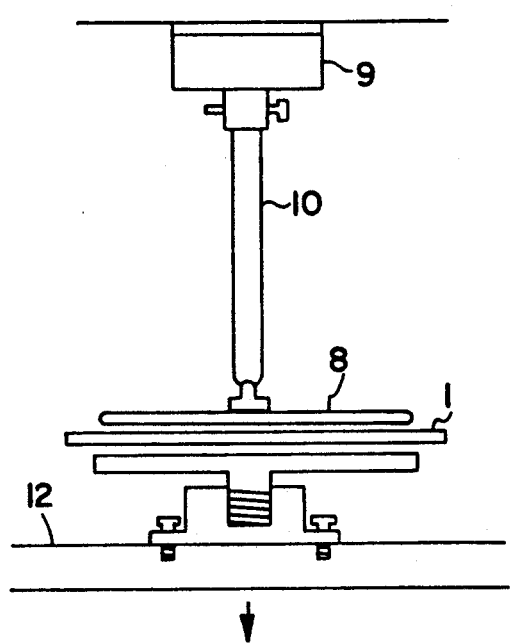
FIG. 4 is cross section of a device for determining the wafer holding power of the backing pad obtained in Example 1.

The backing pad was tested for wafer holding force by the use of a device illustrated in FIG. 4, to find the relation between the diameter of holes and the wafer holding force of the backing pad. The backing pad was applied fast to a disc of SUS 4 inches in diameter and the disc was set in place on a cross head. A semiconductor wafer measuring 4 inches in diameter and provided at the center thereof with a Keblar yarn hooking fixture was pressed strongly in its unmodified form (in a dry state) against and attached fast to the backing pad. The cross head was moved downwardly at a speed of 200 mm/min. until the maximum strength required to separate the wafer from the backing pad was recorded on a recorder. This measurement was performed 10 times. The results are shown in Table 1. In Table 1, the diameter of pores of backing pad represents the value found by observation through an electron microscope. Each of the ranges of numeral values of diameter indicated in the table is meant to imply that pores of varying diameters whose numeral values fall in the particular range were distributed in a given backing pad. The symbol "x" stands for average value and the symbol "s" for standard deviation.

TABLE 1

| Diameter of pore | 0~1 μm | 10~30 μm | 30~60 μm | 120 μm min. |
|---|---|---|---|---|
| X | 1.63 | 1.29 | 0.25 | 0 |
| S | 0.79 | 0.39 | 0.05 | 0 |
| S/X (%) | 48.5 | 30.2 | 20.3 | 0 |

It is clearly noted from Table 1 that the wafer-holding power of backing pad increased as the diameter of pores decreased.

Semiconductor wafers were polished with wafer holding jigs of the construction of FIG. 3 using backing pads possessing satisfactory wafer holding power and containing pores of a diameter of 0 to 1 μm and a diameter of 10 to 30 μm. In virtually all semiconductor wafers polished with the backing pad containing pores of a diameter of 0 to 1 μm, the values of LTVmax (representing the maximum of LTV, namely, the difference between the maximum and the minimum of wafer thickness as found in 15 mm×15 mm cells of a given wafer) exceeded 1.0 μm. This is because air forced its way into the boundary between the semiconductor wafer and the wafer-holding surface of the backing pad. In contrast, the semiconductor wafers polished with the backing pad containing pores of a diameter of 10 to 30 μm showed highly satisfactory parallelism and flatness.

EXAMPLE 2

The backing pad obtained in Example 1 which contained pores of a diameter of 10 to 30 μm was attached fast with adhesive agent to a carrier plate made of glass, with the wafer-holding surface laid upwards. The wafer-holding surface of the backing pad was subjected to precision surface grinding with a precision surface grinder (produced by Shibayama Kikai K.K.) using abrasive grains of diamond measuring 50 to 100 μm in average grain size until the difference between the maximum and the minimum of thickness of the backing pad measured at a total of 5 points, one point at the center and four points at an inward distance of 5 mm from the terminals of two perpendicularly intersecting diameters after one minute's application of a load of 300 gf/cm$^2$ decreased to 1 μm.

Figure 5:
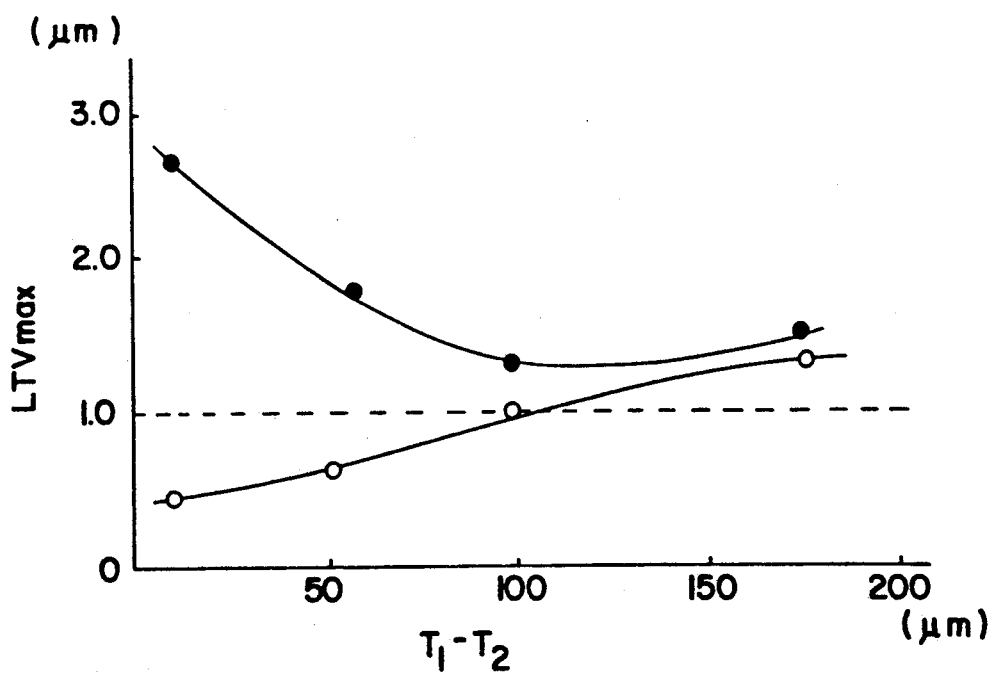
FIG. 5 is a graph showing the relation between the softness of backing pad $(T_1-T_2)$ before and after precision surface grinding in Example 2 and the flatness, LTVmax, of a wafer polished by the use of the backing pad.
Figure 6:
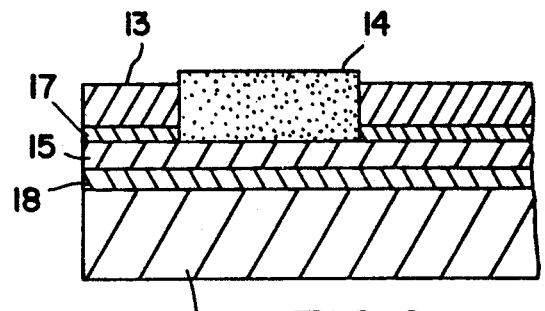
FIG. 6 is a cross section of a conventional wafer holding jig.
Figure 7:
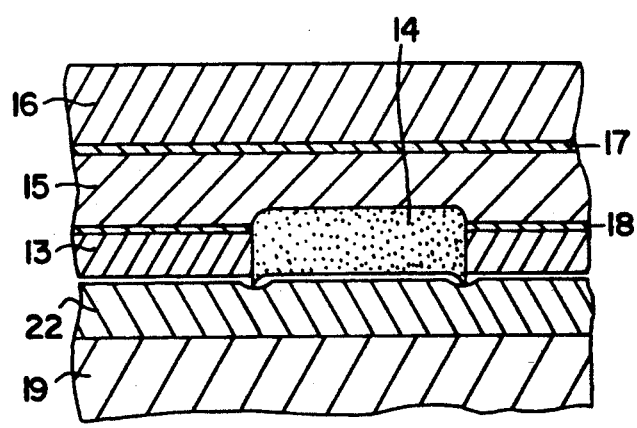
FIG. 7 is a cross section illustrating the state of polishing performed on a semicondcutor wafer held in place by the use of the wafer holding jig of FIG. 6, FIG. 8 (a) is a typical cross section illustrating a semiconductor wafer of FIG. 7 before polishing, and FIG. 8 (b) is a typical cross section illustrating the semiconductor wafer of FIG. 7 after polishing.
Figure 8A:
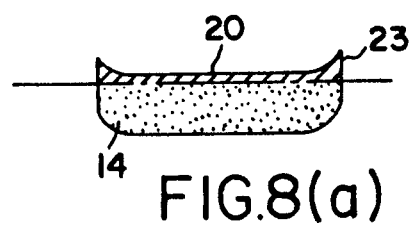
Figure 8B:
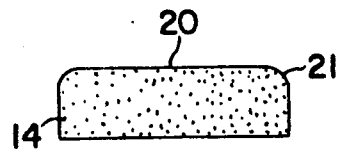

The relation between the softness of the backing pad before and after the surface grinding work and the flatness of the semiconductor wafer polished with a wafer holding jig constructed as illustrated in FIG. 3 and using the backing pad is shown in FIG. 5. The black circles found in FIG. 5 represent the data obtained before the surface grinding and the blank circles those obtained after the surface polishing.

The elasticity of the backing pad was expressed by the difference between the thickness, $T_1$, under a load of 300 gf/cm$^2$ and the thickness, $T_2$, under a load of 1,800 gf/cm$^2$ ($T_1-T_2$) and the planarity of the wafer was expressed by the aforementioned LTVmax measured with a capacitance type flatness tester (produced by Japan ADE K.K.).

It is noted from FIG. 5 that with backing pads which had not been subjected to surface grinding work, the semiconductor wafers finished by polishing possesses LTVmax values invariably exceeding 1.0 μm and exhibiting poor parallelism and flatness, without reference to the magnitude of ($T_1-T_2$). In contrast, with backing pads which had undergone the surface grinding work and, consequently, acquires ($T_1-T_2$) magnitudes falling in the range of 1 to 100 μm and LTVmax magnitudes not exceeding 1.0 and lowered below those shown before the surface grinding work, semiconductor wafers finished by surface polishing manifested highly satisfactory parallesism and flatness.

While the present invention has been described by means of a specific embodiment, it is to be understood that numerous changes and modifications may be made therein without departing from the spirit and scope of the invention as defined in the appended claims.

It is plain from the description given thus far that the backing pad of this invention exhibits highly satisfactory adhesive force to a semiconductor wafer and allows production of a finished semiconductor wafer excelling in parallelism and flatness. The wafer so finished acquires still better parallelism and flatness when the wafer holding surface of the backing pad is subjected to precision surface grinding before its use in the wafer polishing work.

What is claimed is:

1. A method for polishing a semiconductor wafer, characterized by preparing a finished backing pad by the steps comprising:
   a. fixing a backing pad blank on a carrier plate with a wafer-holding surface thereof laid upwards and surface grinding the wafer-holding surface of said backing pad blank with a precision surface grinder until said wafer-holding surface has a flatness such that the difference between a maximum and a minimum, (TV$_5$,) of thickness of said backing pad measured at a total of five points, i.e. one point at the center thereof and four points at an inward distance of 5 mm from terminals of two perpendicularly intersecting diameters thereof, after one minute's exertion thereto of a load of 300 gf/cm$^2$, is not more than 1 μm,
   b. placing said semiconductor wafer on a wafer holding jig having a template containing at least one wafer-positioning hole fixed on a carrier plate in such a manner that said backing pad enters said positioning hole; and
   c. polishing said semiconductor wafer.

2. A method according to claim 1, wherein a gap in the range of from 0.5 to 1.5 mm is interposed between an inner edge of said wafer-positioning hole of said template and an outer edge of said backing pad.

* * * * *